United States Patent [19]

Maelzer et al.

[11] Patent Number: 4,724,377
[45] Date of Patent: Feb. 9, 1988

[54] APPARATUS FOR TESTING ELECTRICAL PRINTED CIRCUIT BOARDS

[76] Inventors: Martin Maelzer; Erich Luther, both of Hagenburger Strasse 26, D-3050 Wunstorf; Rüdiger Dehmel, Ringstrasse 22a, D-3050 Wunstorf; Hans H. Higgen, Am Bückeberg 7, D-3060 Stadthagen, all of Fed. Rep. of Germany

[21] Appl. No.: 59,142
[22] PCT Filed: Nov. 4, 1983
[86] PCT No.: PCT/EP83/00289
§ 371 Date: Jun. 26, 1984
§ 102(e) Date: Jun. 26, 1984
[87] PCT Pub. No.: WO84/01831
PCT Pub. Date: May 10, 1984

Related U.S. Application Data

[63] Continuation of Ser. No. 627,570, Jun. 26, 1984, abandoned.

[30] Foreign Application Priority Data
Nov. 5, 1982 [DE] Fed. Rep. of Germany ....... 3240916

[51] Int. Cl.⁴ .............................................. G01R 15/12
[52] U.S. Cl. ........................... 324/73 PC; 324/158 F; 324/158 P
[58] Field of Search ........... 324/158 F, 158 P, 73 PC, 324/72.5

[56] References Cited

U.S. PATENT DOCUMENTS 3,654,585 4/1972 Wickersham ............... 324/158 F X
4,164,704 8/1979 Kato et al. .................. 324/73 PC
4,417,204 11/1983 Dehmel et al. ............. 324/158 F X

FOREIGN PATENT DOCUMENTS 3110056 9/1982 Fed. Rep. of Germany .
3340180 5/1985 Fed. Rep. of Germany .

Primary Examiner—Reinhard J. Eisenzopf
Assistant Examiner—Vinh P. Nguyen
Attorney, Agent, or Firm—Fitzpatrick, Cella, Harper & Scinto

[57] ABSTRACT

In a universal testing apparatus for electrical printed circuit boards in each case a quotient of test pins (26) covering a partial grid field is to be provided on one of several separable modules (27) which contains that part of the switch matrix which corresponds to this test pin quotient. Each module (27) is to be connectable electrically with other modules (27) and/or the control circuit part (32) of the apparatus. The apparatus also has a perforated grid plate (24) provided with guide holes (36) for the test pins (26), on which the modules (27) may be suspended so that the test pins (26) engage through the guide holes (36). Futhermore, the modules (27) are to be shaped so that they can be assembled in the form of building blocks in order to cover a partial area, corresponding to the printed circuit board (22) to be tested, of the total grid field defined by the perforated grid plate (24).

20 Claims, 6 Drawing Figures

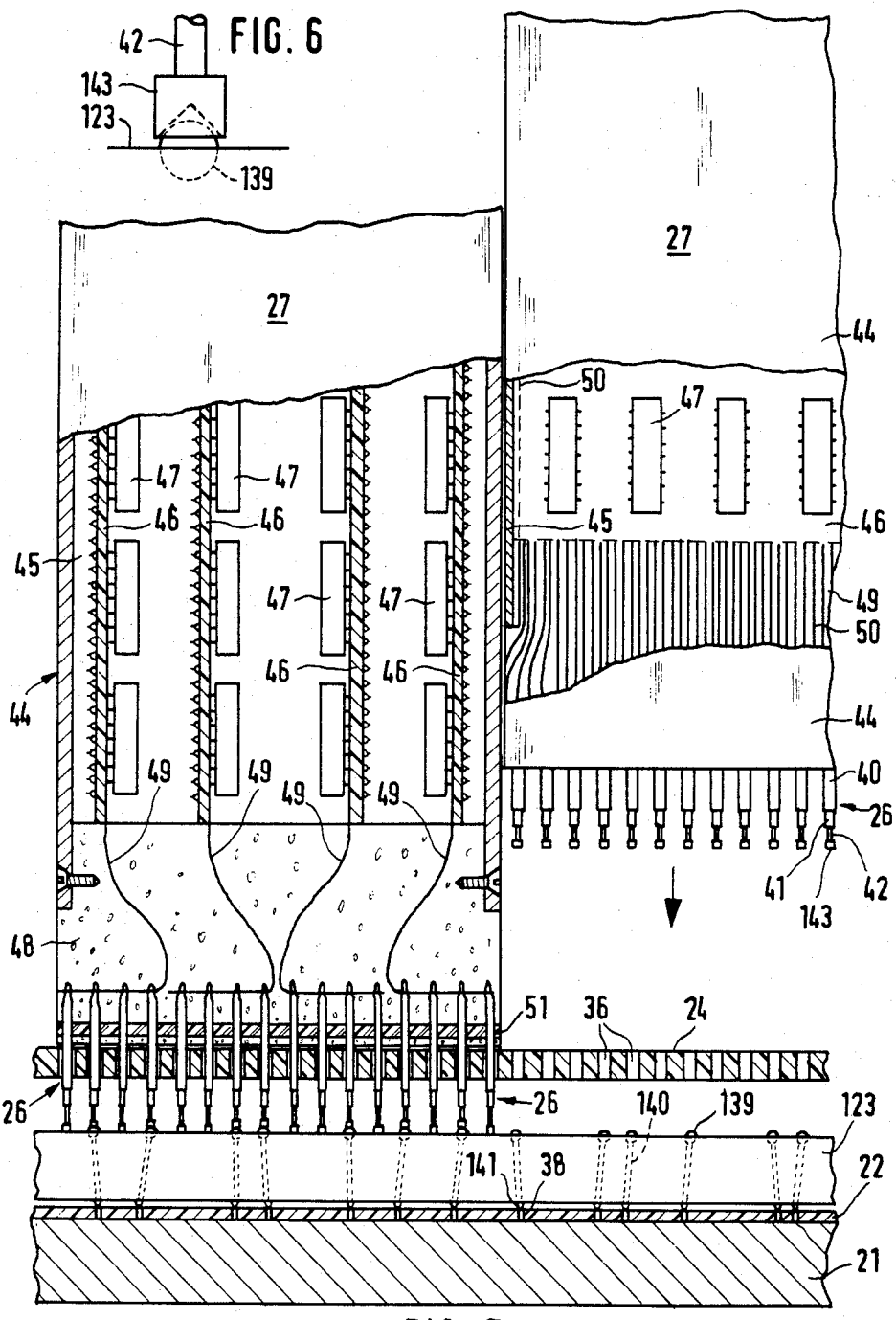

APPARATUS FOR TESTING ELECTRICAL PRINTED CIRCUIT BOARDS

This application is a continuation of application Ser. No. 627,570 filed 6/24/84.

This invention relates to an apparatus for testing electrical printed circuit boards, with a supporting part for the respective printed circuit board to be tested, with a plurality of test pins, arranged to form a specific grid, which can be placed on the printed circuit board directly or by way of an interconnecting grid matching adapter, with a switch matrix connected with each of the test pins, and with a control circuit part connected with the switch matrix.

A distinction is made between special testing apparatus and universal testing apparatus. In the case of the special testing apparatus a test adapter is used which is provided with only as many test pins as are required to test the specific type of printed circuit board. For each type of printed circuit board a particular test adapter must therefore be provided which must then be inserted into the apparatus. In contrast with this, a universal test adapter has a plurality of test pins which cover a grid field which is so large that each point of the grid, irrespective of whether or not it is a test point, can be scanned with a test pin. The advantage of the universal testing apparatus compared with the special testing apparatus is self-evident. It consists in that it is no longer necessary to keep in readiness various adapters matched to the individual types of printed circuit board. Instead of this, with a universal testing apparatus any type of printed circuit board can be tested without changing the test adapter.

However, the universal testing apparatus has limitations with regard to the size of the printed circuit boards to be tested, at any rate with regard to the construction principle hitherto used. This provides for the test pins in their entirety to be secured to a single carrier plate which covers a grid field which is at least the size of the largest printed circuit board to be tested. As the test pins normally have spring mounted test probes which are pressed onto the printed circuit board or against which the printed circuit board is pressed, the carrier plate, which is held only at its edges, is subject to a great bending load. It should be remembered in this connection that modern universal testing apparatus have as many as 30,000 test pins, each of which exerts with its test probe a presure of approximately 100 p. (ponds:equal to 3.53 ounces); The carrier plate is therefore subject to a bending load of approximately 3t. (tons:equal to 6,614 pounds) However, deflections of the carrier plate result in measurement inaccuracies, as the test pins disposed in the centre of the carrier plate are pressed with less force against the printed circuit board to be tested than are those test pins which are disposed at the edge of the carrier plate. In order to avoid deflections, it was previously attempted to make the carrier plate as thick as possible, for example 20 to 30 mm thick. However, this has the disadvantage that holes for receiving the test pins in the grid cannot be bored into carrier plate of such a thickness, or can be bored only with great difficulty. Moreover, the test pins must be longer than in the case of thin carrier plates, so that they can project with their end which is remote from the test probe out of the carrier plate and be wired. An attempt has been made to overcome the difficulties by giving the carrier plate a sandwich construction. However, this increases the cost of the testing apparatus, as does the use of longer test pins. The present construction principle of known universal testing apparatus further provides for each test pin to be connected with a switch matrix, formed as separate circuit part, by means of a line of greater or lesser length. The switch matrix has the function of connecting ecah of the test pins in chronological succession into a testing current path. The line connections are presently made by hand and, due to the cramped conditions, can be effected only by one single person. To wire a universal testing apparatus having 30,000 test pins takes approximately two months. A result of this long assembly period is also a correspondingly high cost for universal testing apparatus of the conventional type.

The object underlying the invention is to specify a new construction principle for a universal testing apparatus with which the disadvantages described above can be avoided.

The invention is achieved in that in each case a quotient of test pins covering a partial grid field is provided on one module which is separable from several and which contains that part of the switch matrix which corresponds to this test pin quotient, and which can be connected electrically with other modules and/or the control circuit part, in that a perforated grid plate provided with guide holes for the test pins is provided opposite the printed circuit board support, on which perforated grid plate the modules can be placed so that the test pins engage through the guide holes, and in that the modules are shaped so that they can be assembled in the form of building blocks in order to cover a partial area, corresponding to the printed circuit board to be tested, of the total grid field defined by the perforated grid plate.

The modular concept dispenses with a thick carrier plate for the test pins. The perforated grid plate, which would be comparable to the carrier plate, no longer has to carry a bending load, but serves only to guide the test pin. The load produced by the contact pressure of the spring mounted test pins is carried by each of the modules themselves. The construction of a module in the form of a block, and the limited number of test pins provided thereon mean that it does not undergo any change in shape. For their part, the modules can be secured at their side which is remote from the perforated grid plate to a supporting part which can support thereon and which is connected mechanically by way of a connection of great tensile strength with the supporting part for the printed circuit board to be tested.

An additional advantage of the use of modules consists in that these can be manufactured in parallel. This shortens the assembly period and reduces the cost of manufacturing the testing apparatus as a whole. Added to this is the fact that the connections between the test pins of a module and the partial switch matrix contained in the module can be surveyed with greater ease, and to realize these there may be used switching equipment which is more modern than the hitherto usual wires which produced a practically unsurveyable confusion of wire. This improved facility of inspection and the modern switching equipment also shorten the production period and reduce the cost of the apparatus. Not least, the apparatus is also made lighter, as the connections between the test pins and the partial switch matrix in a module can be made optimally short. In the extreme instance, direct integration in conceivable.

The modular concept also has advantages for the user. When the user has several testing apparatus of the type described above, then it is sufficient for him to purchase a limited number of modules therefor. The reason for this is that it is improbable that all the apparatus require so many modules that the whole grid field defined by the perforated grid plate is covered. On the contrary, the normal case will be that he can use modules which are not required for one testing apparatus for another testing apparatus of which the printed circuit boards to be tested require more modules. In other words, the user can keep the initial cost for a universal testing apparatus within limits determined by him if, in the first instance, he orders only a relatively small, yet adequate number of modules. He is free to add to his testing apparatus later by purchasing further modules.

A further, essential advantage of the modular concept consists in that maintenance is simplified. When, in the case of conventional machines, a fault occurs at a test pin, the switch matrix or cabling between the test pins and the switch matrix, then the testing apparatus as a whole is no longer operable. According to the new concept, on the other hand, it is possible simply to replace the respective module at which the fault occurs by a module which is operating satisfactorily. The faulty module can then be posted to the manufacturers for repair, as it is light and has relatively small dimensions.

It should also be pointed out that with the testing apparatus according to the invention it is possible to cover grid field sizes which are not within reach of the conventional testing apparatus. This is because the limits set by the bending load of the carrier plate and by the expenditure in terms of cabling no logner exist.

An exemplary embodiment of the invention is described in the following with reference to the drawings.

FIG. 5 shows a section similar to FIG. 4, here, however, using a grid matching adapter for printed circuit boards of which the holes are not arranged in the standard grid;

FIG. 6 shows an enlarged test head from FIG. 5.

Figure 1:
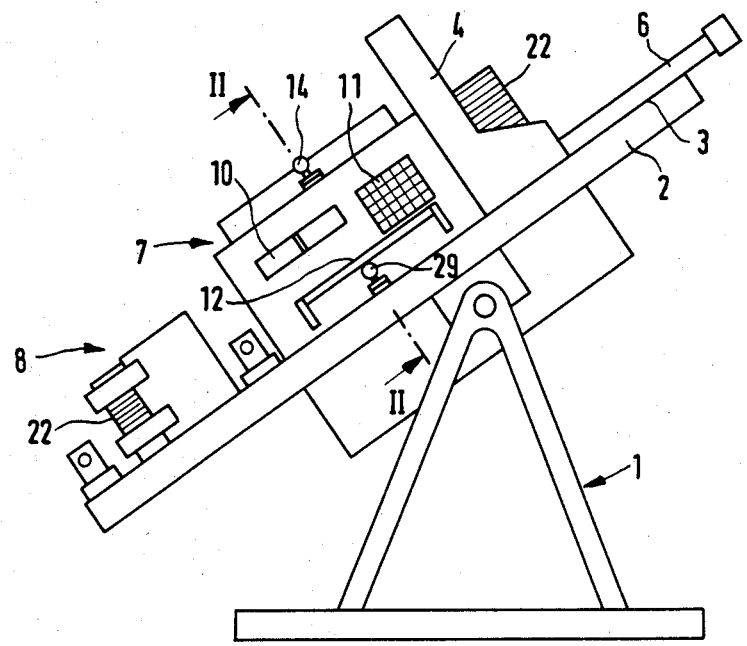
FIG. 1 shows a schematic lateral view of a universal testing apparatus.

The universal testing apparatus represented in FIG. 1 is arranged on a frame 1 which carries an oblique table 2. On the top surface of the table there is a cartridge 4 for the printed circuit boards 22 to be tested. The printed circuit boards 22 are pushed in cycles out of a cartridge 4 by means of a slide. A pneumatic cylinder 6 serves to actuate the slide.

A testing part 7 is connected to the cartridge 4. The testing part 7 has a display window 10 for any faults located. Furthermore, the testing part 7 is provided with a keyboard 11 in order to input the individual operating functions. The testing part can be swivelled upwards by means of a handle 12 about a swivelling axis (not visible in FIG. 1) in parallel with the oblique table plane 3.

The printed circuit boards which have been tested slide as a result of the force of gravity on the oblique table plane 3 into a sorting part 8. The test result of the testing part 7 is communicated to the control of the sorting part 8, with the result that the sorting part 8 sorts the printed circuit boards into those having undesired printed conductor connections, into those having undesired printed conductor interruptions, and into those which are good. The stack of good printed circuit boards 22 is recognizable in the sorting part 8.

Figure 2:
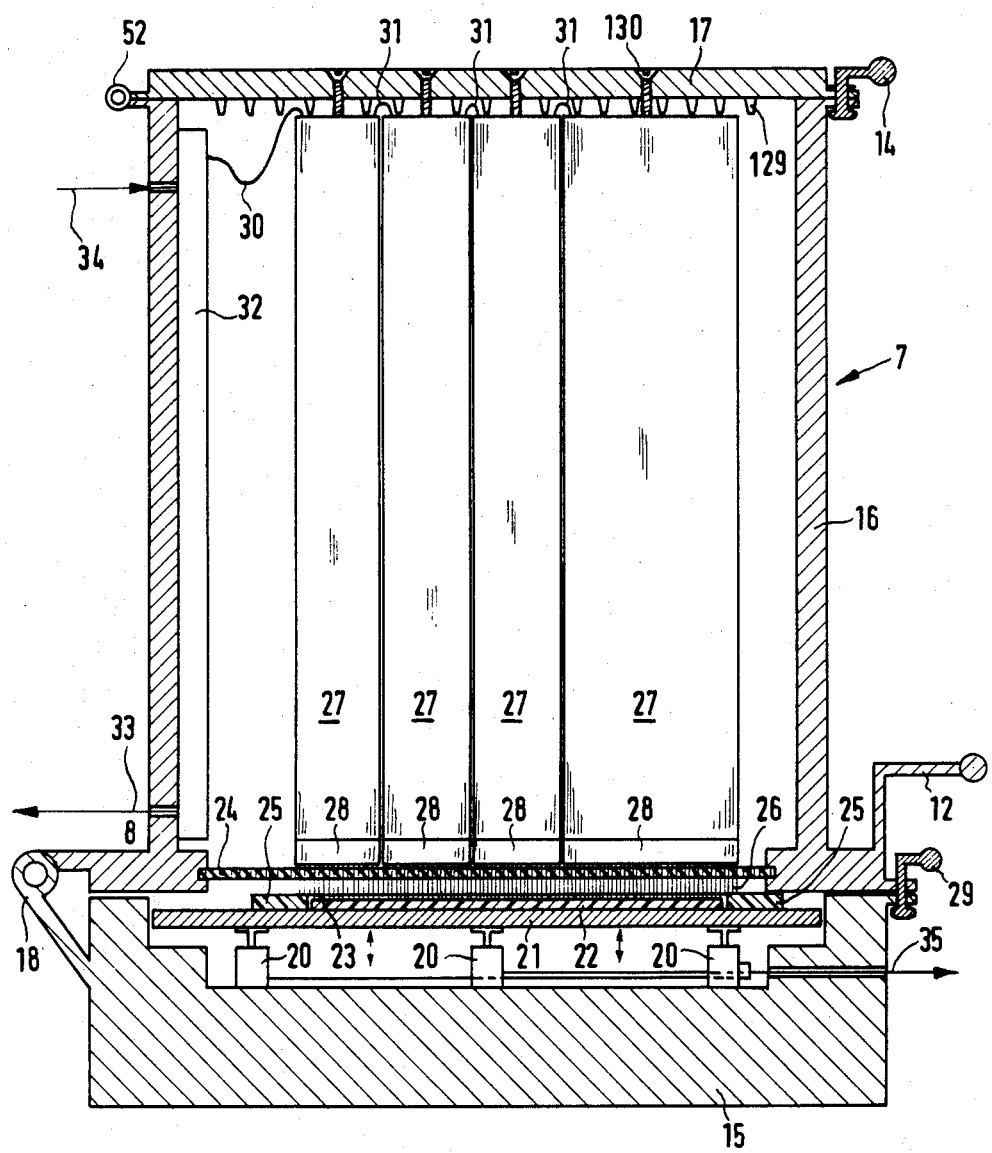
FIG. 2 shows a section II—II through FIG. 1.

According to FIG. 2 the testing part 7 consists of a bottom part 15 and of a top part 16 which are joined by a hinged joint 18. The top part 16 can, as already mentioned in connection with FIG. 1, be swivelled up by lifting the handle 12. The bottom part 15 and the top part 16 can be locked toward by means of a lock 29.

A supporting part 17 is secured to the top part 16 by a further hinged connection 52. The supporting part 17 can be swivelled up about the hinged connection 52 relative to the top part 16. The supporting part 17 can also be locked with the top part 16 by means of a lock 14.

Inside the bottom part 15 there is a supporting plate 21 for the printed circuit board 2 to be tested. The supporting plate 21 can be raised and lowered respectively by means of three lifting cylinders 20. The three lifting cylinders 20 are supplied with pressure fluid or compressed gas from a fluid source via a line 35. In the lowered position the surface of the supporting plate 21 is aligned with the table plate surface 3 in FIG. 1. The direction of transport runs perpendicularly to the plane of the drawing. The carrier plate 23 laying on the supporting plate 21 is confined laterally by guides 25 during transportation.

Figure 4:
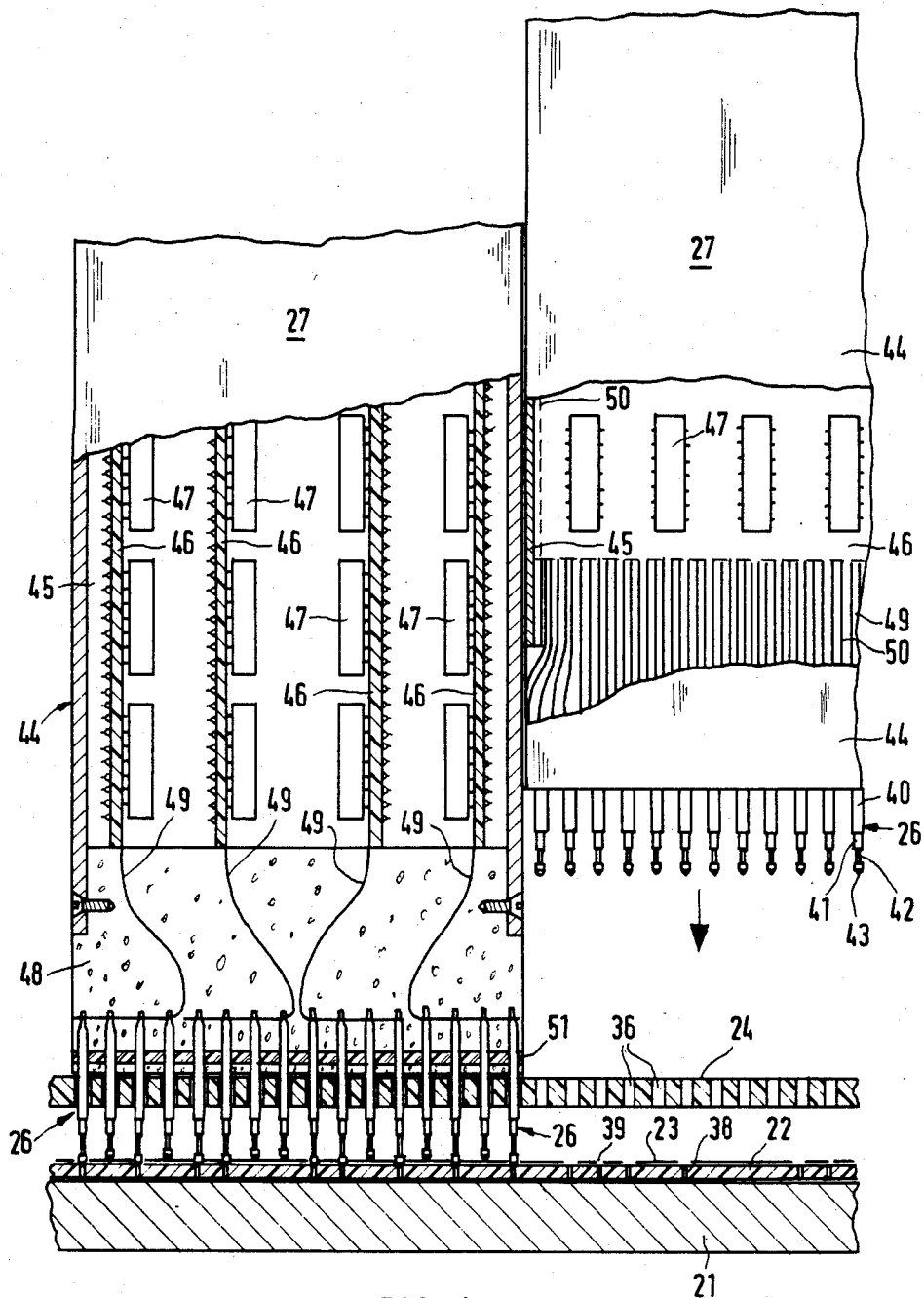
FIG. 4 shows a section through a module in parallel with its narrow side and also a section through a portion of a further module in parallel with its longitidinal side and also the perforated grid plate, the printed circuit board to be tested and the supporting part.

Above the printed circuit board 22 to be tested, of which the holes are arranged here in the standard grid dimension, there is in the top part 16 a perforated grid plate 24 with guide holes 36 likewise arranged in the standard grid (see FIG. 4). There are placed on the surface of the perforated grid plate 24 modules 27 which are provided on their lower faces with test pins 26 which engage through the guide holes 36 in the perforated grid plate 24. Above the printed circuit board 22 to be tested there is a foil 23 with holes 39 (see FIG. 4) which allow only those test pins 26 which are to encounter test points on the printed circuit board to penetrate onto the printed circuit board 22. The foil 23, which consists of insulating material, is secured in the direction of transport before the printed circuit board to be tested on the underside of the perforated grid plate 24 (not shown) and remains permanently in the apparatus. If a new type of printed circuit board is to be tested, the foil must be changed. The foil has the task of preventing test pins which are not intended for chosen test points on the printed circuit board from striking between two adjacent printed conductors and possibly producing a short circuit. Furthermore, the foil should ensure that the printed circuit board to be tested is spared mechanically by striking only that number of test pins which is absolutely necessary.

Test pins also strike the lateral guides 25, as the partial grid field defined by the test pins of all the modules is usually larger than the printed circuit board due to the fixed dimensions of the modules. The lateral guides 25 must therefore consist of insulating material. They can be removably secured, for example, to the supporting plate 21.

As the test pins have spring mounted test probes 43 (see FIG. 4), and the printed circuit board 22 is pressed against the test pins 26 by means of the lifting cylinders 20, there is a tendency for the modules 27 to be pressed upwards. In order to prevent this, there is provided the supporting part 17 which has on its underside projections 129 against which the rear faces of the modules 27 may brace themselves. As the supporting part 17 is connected mechanically by way of the hinged connection 52 and the lock 14, the top part 16 and also the hinged connection 18 and the lock 29 with the bottom part 15, the modules 27 cannot therefore move upwards under the pressure of the lifting cylinders 20 and under the spring resistance of the test pins 26. The modules 27 are also secured to the supporting part 17, as indicated by the bolt 130. This means, therefore, that the modules 27 are suspended on the supporting part 17, and their weight does not subject the perforated grid plate 24 to bending strain.

The interspaces between the projections 129 allow electrical connections 31 to be made between the modules 27. At least one of the modules is also connected via an electrical connection lines 30 with a control circuit part 32 fixedly provided in the testing part, which control circuit part in turn is connected via a line 34 with the mains i.e. the external electrical power supply. The control circuit part controls the partial switch matrix contained in each of the modules 27. The partial switch matrix has the task of connecting each of the test pins in chronological succession into a testing current path. They may also form, as part of the partial switch matrix contained in each module, an A/D converter circuit which converts the analog testing current signals into digital signals which are then evaluated by the control circuit part 32. However, it is also possible for A/D conversion to take place firstly in the control circuit part 32. The control circuit part 32 therefore ensures that one after the other the test pins of each of the modules 27 (the modules 27 themselves taking their turn in chronological sequence) are acted upon by the testing current. The switch matrix consists practically of a plurality of semiconductor switches which are invoked in succession by the control circuit part 32. In the control circuit part 32 the analog or digitalized testing current signal is then compared with a rated value. Any deviation is recorded as an error which can consist, for example, in a short circuit between two printed conductors or in the interruption of a printed conductor. The control circuit parts 32 controls the sorting part 8 via a line 33 accordingly.

Figure 3:
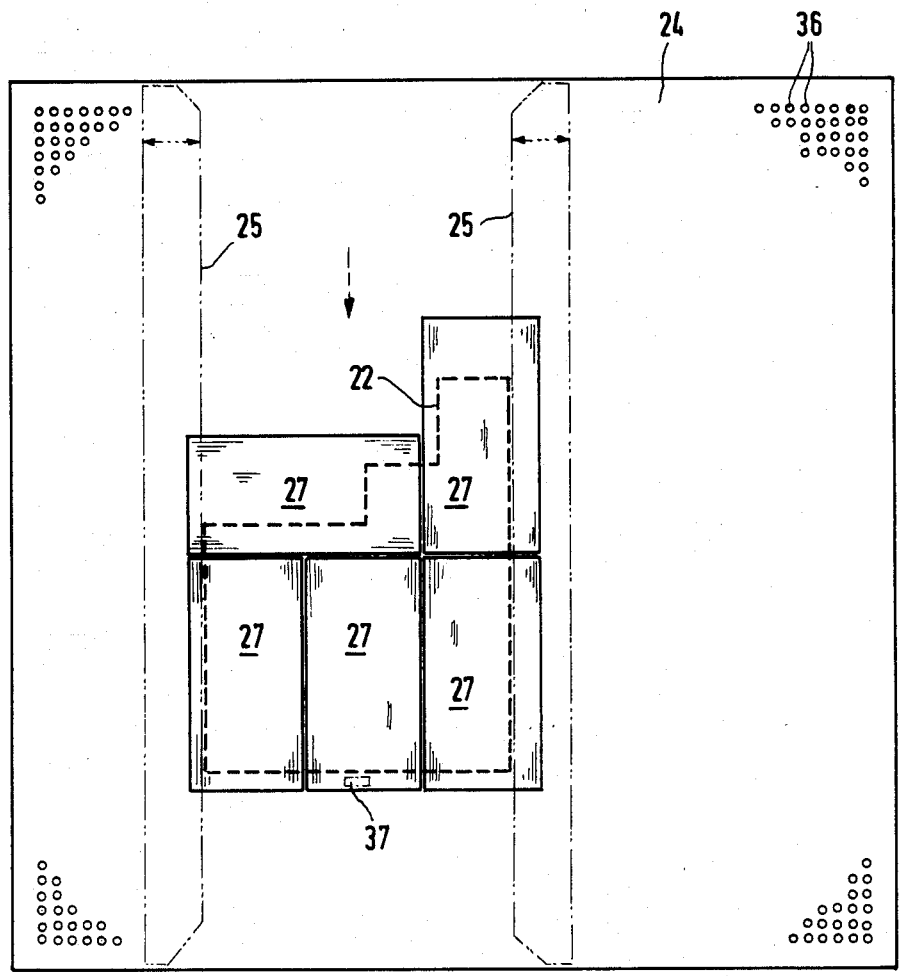
FIG. 3 shows a top plan view of the perforated grid plate with five modules (in a different arrangement than in FIG. 2) with a subjacent printed circuit board and the lateral guides.

FIG. 3 shows the perforated grid plate 24 from above. It can be seen that it is provided with a plurality of guide holes 36 which are arranged in the grid dimension of the printed circuit boards to be tested. The perforated grid plate 24 covers a grid field which is so large that the dimensions of each printed circuit board which is to be tested with the testing apparatus fall within this grid field. In FIG. 3 the printed circuit board 22 to be tested is a great deal smaller than the total grid field of the perforated grid plate 24. Five modules 27, which are arranged in the form of building blocks so that with the smallest number possible they just cover the grid face of the printed circuit board 22 to be tested, suffice to test the printed circuit board 22.

There can also be seen in FIG. 3 the lateral guides 25 for the printed circuit board 22 to be tested. The distance between the lateral guides 25 is chosen so that the printed circuit board 22 occupies a reproducible position beneath the modules 27, and the grid of the test pins 26 of the modules 27 coincides with the grid of the printed circuit board 22. In order to guarantee this, there is also provided a stop 37 which is arranged in the direction of transport of the printed circuit board 22 to be tested (see dot-and-dash arrow) before the printed circuit board. After testing has taken place, the stop 37 is lowered, and the printed circuit board 22 which has been tested can pass in the direction of the sorting apparatus 8. The double arrows on the lateral guides 25 are to indicate that guides are adjustable to match different types of printed circuit board. To supplement FIG. 2, it should also be pointed out here that the height of the guides 25 above the supporting plate 21 should be precisely equal to the total height of the printed circuit board 22 to be tested and the foil 23 lying thereon.

FIG. 4 shows on the left a partial section through a module 27 facing the narrow side, and on the right an additional module 27 facing the wide side, only a part of the latter being visible. The test pins 26 of the left module 27 engage through the guide bores 36 of the perforated grid plate 24 and press with their test probes 43 either through holes 39 in the foil 23 onto test points of the printed circuit board 22 or onto the foil 23. The test points of the printed circuit board are usually where soldering eyes are, in the centre of which there is a bore 38 in the printed circuit board 22.

The guide holes 36 in the perforated grid plate 24 have a slightly larger diameter than the test pins 26, so that the latter can be inserted and taken out again without expending a great deal of energy.

Each module 27 consists of a rectangular, longitudinally extending housing with wide lateral walls 44 and narrow lateral walls 45. The lateral walls are formed by metal plates. There are provided in the narrow lateral walls 45 grooves 50 into which, in the present case, four printed circuit boards 46 are pushed in. IC chips 47 are placed on the printed circuit boards and are soldered with the printed conductors. The IC chips have the function of a controllable electricals switch. In their entirety the printed circuit boards 46 form with the IC chips 47 and, if appropriate, further components the partial switch matrix coordinated with the test pins 26. One board face of each printed circuit board 46 with the printed conductors thereon continues in the direction of the test pins 26. The end sections of flexible printed conductor carriers 49 are provided with holes for the ends of the test pins which are soldered for connection with the printed conductors 50. Each module 27 has, for example, 16×32 test pins of which, in the case of the left module 27, only one narrow side with 16 test pins is visible. Thirty five further test pins extend perpendicularly to the plane of the drawing before and after each test pin 26 respectively. Each of the test pins 26 is soldered with one of the printed conductors 50.

The test pins 26 consist of a carrier sleeve 40 into which a piston sleeve 41 is pushed. In turn there is movably mounted in the piston sleeve 41 a piston plunger 42 with test probe 43. There is arranged in the piston sleeve 41 a spring (not visible) which seeks to press the piston plunger 42 with test probe 43 into the extended position.

The carrier sleeves 40 sit in the bores of a carrier plate 51 which are arranged in the grid dimension of the printed circuit board 22 to be tested. The carrier plate 51 for its part is embedded in an end piece 48 of cast resin, which is pushed with its top section into the housing formed from the walls 44, 45, and of which the buttom section has the same external dimensions as the housing. The purpose of this end piece is to guarantee that the two outer test pins 26 come to lie so close to the edge of the end piece that, when modules 27 are assembled in the building block system, in the boundary area no guide hole 36 of the perforated grid plate 24 remains free. In other words, the cast resin piece 48 enables a specific partial grid field to be covered continuously by several adjacently arranged modules. This is likewise aided by the flexible printed conductor carriers 49 which are wider at the bottom end than in the area of transition to the surface of the printed circuit boards 46.

FIG. 5 shows a view similar to FIG. 4, although for the case where the printed circuit board 22 to be tested has holes 38 which are not arranged in the standard grid dimension. In order to bring those test pins 26 of the modules 27 which are arranged in the grid dimension into contact with the holes 38 of the printed circuit board 22, a grid matching adapter 123 is interconnected here. This has connecting pins 140 which can extend obliquely. These have at the top a crowned, preferably spherical head 139 and at the bottom a point 141 which is in contact with the hole 38 of the printed circuit board 22 and the conductive material enclosing the holes respectively. The test pins 26 of the modules 27 have test heads 143 here which have a recess in the form of a spherical indentation or of a hollow cone in which a crowned head 139 of a test pin 140 can engage. This is shown on a larger scale in FIG. 6.

What is claimed is:

1. Apparatus for testing electrical printed circuit boards, said apparatus comprising a receiving part for receiving a printed circuit board to be tested, said receiving part extending across a grid field, at least one probe module having means for accomodating a plurality of test probes extending therefrom and arranged to correspond to a portion of said grid field, probe module holding means holding said probe module in position adjacent said receiving means so that test probes extending from said probe module can be connected with test points on a printed circuit board to be tested, said holding means being capable of holding a plurality of said probe modules, each probe module containing at least one switching circuit connected to said test probe accomodating means and operable to switch the test probes thereof, in succession, into a test circuit path; and a perforated grid plate arranged between the receiving part and the modules, said grid plate having holes through which test probes from said test probe accommodating means extend toward said receiving part.

2. Apparatus according to claim 1, wherein a plurality of said modules are positioned adjacent each other in said holding means in an arrangement which defines a configuration of a printed circuit board to be tested.

3. Apparatus according to claim 1, wherein a cross-section of each module, in a plane perpendicular to the axes of test probes in said test probe accommodating means, is rectangular.

4. Apparatus according to claim 1, wherein each module is formed, at the end thereof containing said test probe accomodating means, of a hardened castable material held to the open end of a module housing and a facing a printed circuit board on said receiving means, said hardened castable material having the same cross section as the module housing.

5. Apparatus according to claim 1, wherein said receiving part includes lateral guides for maintaining the position of printed circuit boards on said receiving part, said lateral guides being adjustable toward and away from each other in the plane of said printed circuit boards to accommodate printed circuit boards of different lateral/dimensions.

6. Apparatus according to claim 1, further including a grid matching adapter arranged between such test probes and said receiving part, said grid matching adapter having connecting pins extending between said test probes and test contacts on a printed circuit board held in said receiving part, the ends of said test probes contacting corresponding ends of said connecting pins, one of each pair of mutually contacting ends of said test probes and said connecting pins being formed with a recess which is engaged by the other contacting end to permit said connecting pins to extend obliquely.

7. Apparatus for testing electrical printed circuit boards, said apparatus comprising a receiving part for receiving a printed circuit board to be tested, said receiving part extending across a grid field, at least one probe module having means for accomodating a plurality of test probes extending therefrom and arranged to correspond to a portion of said grid field, probe module holding means holding said probe module in position adjacent said receiving means to that test probes extending from said probe module can be connected with test points on a printed circuit board to be tested, said holding means being capable of holding a plurality of said probe modules, each probe module containing at least one switching circuit connected to said test probe accommodating means and operable to switch the test probes thereof, in succession, into a test circuit path, said modules being constructed and arranged in said holding means in a manner so as to carry contact pressure imposed on their respective test probes without undergoing any change in shape.

8. Apparatus according to claim 7 wherein said modules are held in said holding means at the end of said modules remote from said test probe accomodating means and wherein said holding means is connected to said receiving means via a connection of high tensile strength.

9. Apparatus according to claim 7 wherein said holding means is a housing which extends longitudinally in a direction perpendicular to a printed circuit board on said receiving means.

10. Apparatus according to claim 7 wherein at least one printed electrical switch matrix circuit board is mounted within each module to extend therein a direction parallel to test probes in said test probe accomodating means, said switching circuit being mounted on said switch matrix circuit board and flexible printed conductor carriers connected between said text probes in probe accomodating means and said switch matrix circuit board.

11. Apparatus according to claim 7, wherein said receiving part comprises a printed circuit board supporting plate and means for moving said supporting plate towards the away from said modules.

12. Apparatus according to claim 11, wherein said means for moving said support plate comprises at least one fluid driven lift cylinder.

13. Apparatus according to claim 7 wherein the test probes on said module are spring mounted on pins.

14. Apparatus according to claim 7, further including a grid matching adapter arranged between such test probes and said receiving part, said grid matching adapter having connecting pins extending between said test probes and test contacts on a printed circuit board held in said receiving part, the ends of said test probes contacting corresponding ends of said connecting pins, one of each pair of mutually contacting ends of said test probes and said connecting pins being formed with a recess which is engaged by the other contacting end to permit said connecting pins to extend obliquely.

15. Apparatus for testing electrical printed circuit boards, said apparatus comprising a receiving part for receiving a printed circuit board to be tested, said receiving part extending across a grid field, at least one probe module having plurality of test probes extending therefrom and arranged to correspond to a portion of said grid field, probe module holding means holding said probe module in position adjacent said receiving means so that the test probes of said probe module can be connected with test points on a printed circuit board to be tested, said holding means being capable of holding a plurality of said probe modules, each probe module containing at least one switching circuit connected to its test probes and operable to switch the test probes thereof, in succession, into a test circuit path, said modules being constructed such that such test probes are accomodated to the modules and said modules being shaped to permit assembly thereof side by side such that said test probes cover the grid field of a printed circuit board to be tested.

16. Apparatus according to claim 15 wherein said modules are supported on the ends thereof opposite said test probes and wherein said modules are constructed to carry the pressure exerted on their respective test probes.

17. Apparatus according to claim 16, wherein said test probes are each spring mounted.

18. Apparatus according to claim 15 wherein a perforated grid plate is arranged between said modules and said receiving part, said grid plate being formed with guide holes through which said test probes fixed to said modules extend.

19. Apparatus according to claim 16 whrein a perforated grid plate is arranged between said modules and said receiving part, said grid plate being formed with guide holes through which said test probes fixed to said module extend.

20. Apparatus according to claim 15, further including a grid matching adapter arranged between such test probes and said receiving part, said grid matching adapter having connecting pins extending between said test probes and test contacts on a printed circuit board held in said receiving part, the ends of said test probes contacting corresponding ends of said connecting pins, one of each pair of mutually contacting ends of said test probes and said connecting pins being formed with a recess which is engaged by the other contacting end to permit said connecting pins to extend obliquely.

* * * * *